US007840929B2

(12) United States Patent
Cheng et al.

(10) Patent No.: US 7,840,929 B2
(45) Date of Patent: Nov. 23, 2010

(54) METHOD FOR AUTOMATICALLY MODIFYING FRAME OF CIRCUIT DIAGRAM

(75) Inventors: Yung-Chien Cheng, Taipei (TW); Chiu-Feng Tsai, Taipei (TW)

(73) Assignee: Inventec Corporation, Taipei (TW)

( * ) Notice: Subject to any disclaimer, the term of this patent is extended or adjusted under 35 U.S.C. 154(b) by 517 days.

(21) Appl. No.: 11/984,283

(22) Filed: Nov. 15, 2007

(65) Prior Publication Data

US 2009/0132978 A1 May 21, 2009

(51) Int. Cl.
G06F 9/455 (2006.01)
G06F 17/50 (2006.01)
(52) U.S. Cl. ............................................ 716/11
(58) Field of Classification Search ............... 716/11
See application file for complete search history.

(56) References Cited

U.S. PATENT DOCUMENTS 7,013,028 B2 * 3/2006 Gont et al. ................. 382/113

2006/0225018 A1 * 10/2006 Kitamura ..................... 716/13
2007/0064534 A1 * 3/2007 Kitamura ..................... 367/72
2008/0109773 A1 * 5/2008 Douriet ......................... 716/5

OTHER PUBLICATIONS

Jones, David; "PCB Design Tutorial"; Jun. 29, 2004; Revision A; pp. 1-25.*

* cited by examiner

Primary Examiner—Jack Chiang
Assistant Examiner—Suresh Memula
(74) Attorney, Agent, or Firm—Muncy, Geissler, Olds & Lowe, PLLC

(57) ABSTRACT

A method for automatically modifying a frame of a circuit diagram is applicable for a computer-executable circuit layout software, which determines intersection or discontinuity of line segments generated after a diagram is converted through using a program, and automatically corrects the diagram to output a complete circuit diagram, so as to enhance the convenience of reading and determining the circuit diagram, and to simplify manual inspection procedures, and thus the working process is accelerated.

3 Claims, 6 Drawing Sheets

METHOD FOR AUTOMATICALLY MODIFYING FRAME OF CIRCUIT DIAGRAM

BACKGROUND OF THE INVENTION

1. Field of the Invention

The present invention relates to a method for modifying a circuit diagram, and more particularly to a method for modifying a circuit diagram, which is capable of determining and modifying defects of line segments for a circuit diagram.

2. Related Art

Computer-aided design (CAD) in advance is one of the important tasks in the design of printed circuit boards (PCBs), which mainly includes two parts, one is the preceding placement operation, and the other is the subsequent circuit layout operation.

When researchers in mechanical sector deliver the edited circuit diagrams to researchers in PCB sector, problems of incomplete frames such as intersection and discontinuity of line segments may occur in the circuit diagrams, which must be corrected manually by the researchers in PCB sector. As a result, human negligence often occurs in the correction process, and the working process of product design is prolonged.

FIG. 1 is a schematic view of intersection and discontinuity problems of line segments generated when circuit diagrams are converted currently. Referring to FIG. 1, as the circuit diagrams drawn by the mechanical sector and the PCB sector are in different metric units, problems that the line segments are intersected with one another or they are discontinuous may occur to the circuit diagrams during the conversion process. As shown in FIG. 1, the researchers of PCB sector must correct positions of the line segments manually for Position A where the line segments are intersected and Position B where the line segments are discontinuous before the circuit diagrams can be further used.

Different sectors adopt different metric units to draw the circuit diagrams, so the line segment intersection or discontinuity (i.e., line segment defects) will occur when the circuit diagrams are inspected, which thus causing problems when researchers in different sectors read and determine the circuit diagrams. Accordingly, the researchers in different sectors must correct the circuit diagrams again, which is a waste of human resources.

SUMMARY OF THE INVENTION

In view of the above problems, the present invention is directed to a method for automatically modifying a frame of a circuit diagram, in which line segment defects in the circuit diagram are found out through a program, and the line segments with errors are automatically deleted or connected, so as to correct the circuit diagram to output a complete circuit diagram, and thus, human resources are saved and a working process of product design is accelerated.

The method for automatically modifying a frame of a circuit diagram according to the present invention is applied in computer-executable circuit layout software, for modifying line segment defects of the frame generated after the circuit diagram is converted. The method includes the following steps.

As for the line segment defect that the line segments are intersected with one another, those intersected line segments, sharing an intersection, of the line segment path in the circuit diagram are searched, and each intersection shared by the intersected line segments are set as a first node, and then, one or more exceeding line segments each between the end point of the intersected line segment and the first node thereof closest to the end point thereof are computed; then, the exceeding line segments are deleted, so as to solve the problem of the line segment defect.

As for the line segment defect that the line segments are discontinuous, partial line segments each that is not intersected with another line segment in the circuit diagram are searched to computing an extension line segment extended from the end point of each the searched partial line segment; next, extension line segments from end points of the line segments are calculated in advance; then, the intersection of the extension line segment are set as second nodes; and then, the end points of the line segments where the extension line segments belong to are connected to the closest second nodes, so as to solve the problem of the line segment defect.

According to the method for automatically modifying a frame of a circuit diagram, different sectors can still adopt the currently-used metric units to draw circuit diagrams. When the circuit diagrams in different metric units are inspected, the program automatically corrects the line segment defects in the circuit diagram, such that researchers in different sectors can read and determine the circuit diagrams more conveniently, the human resources are saved, and the working process of product design is accelerated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 2A:
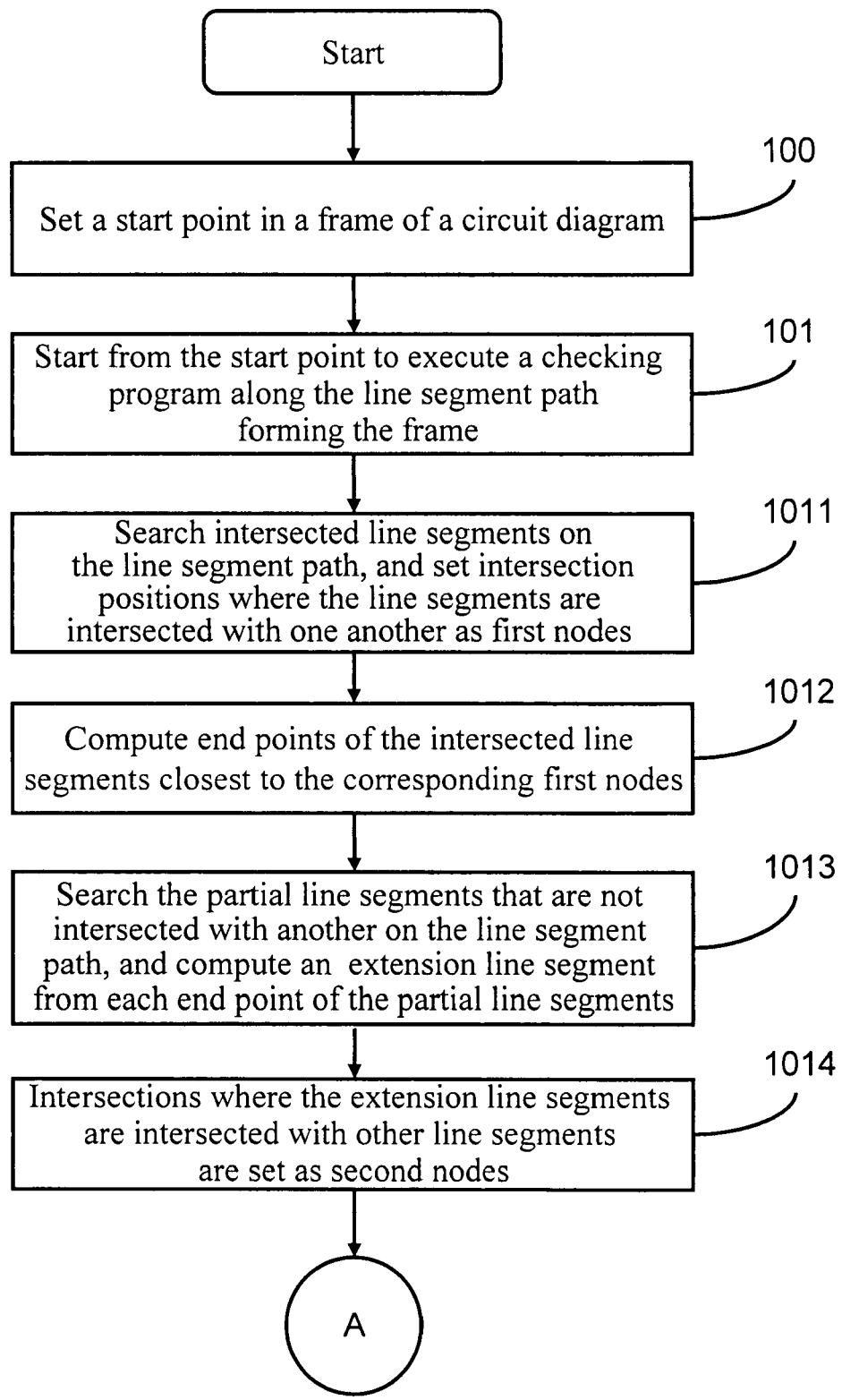
FIGS. 2A and 2B are flow charts of an embodiment of the present invention.
Figure 2B:
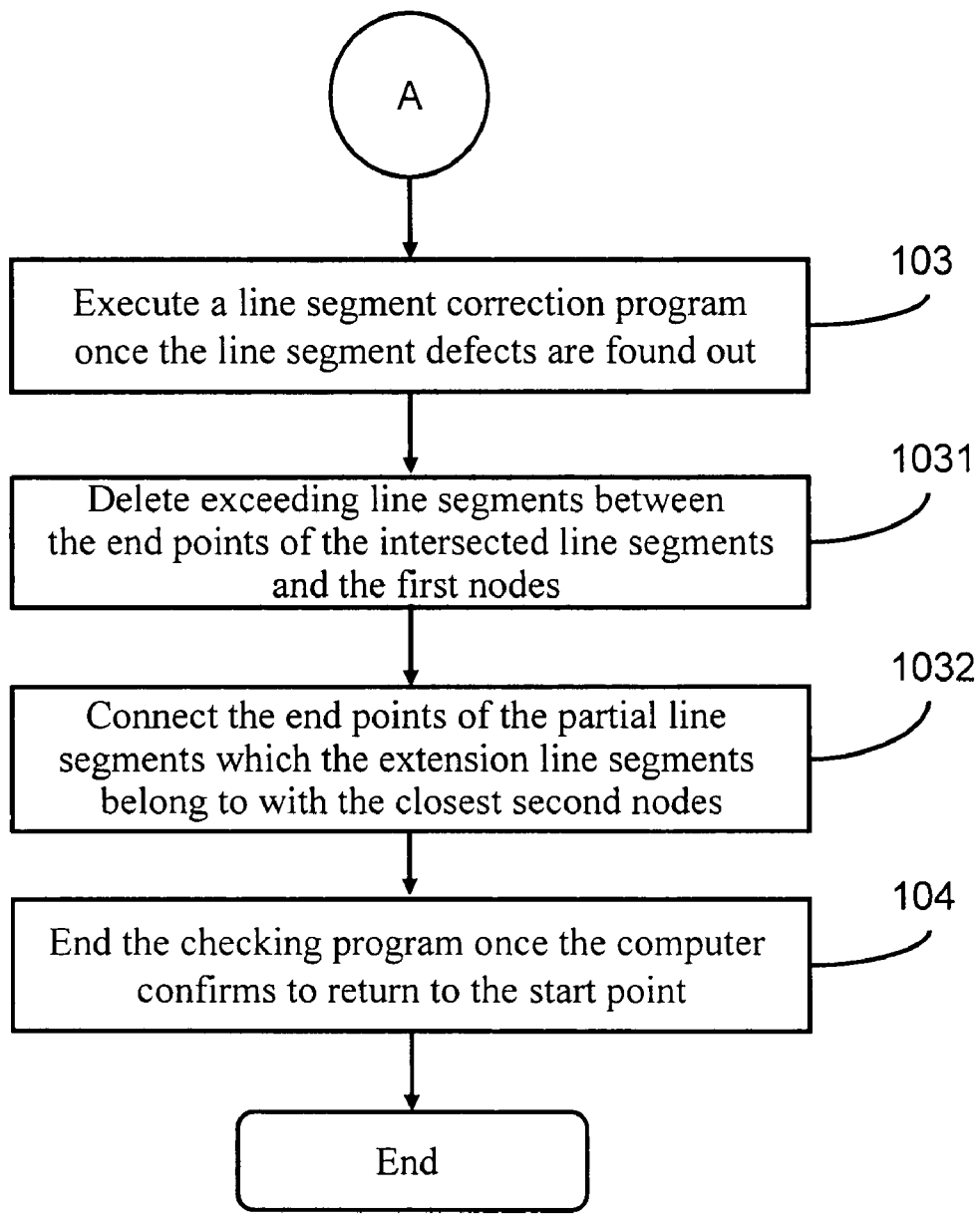

FIGS. 2A and 2B are flow charts of an embodiment of the present invention. Referring to FIGS. 2A and 2B, the method for automatically modifying a frame of a circuit diagram according to the present invention includes the following steps.

Firstly, a start point is set in a frame of a circuit diagram (Step 100). Coordinates of the start point can be determined randomly by a computer, or determined by the user. Then, the computer starts from the start point to execute a checking program along a line segment path forming the frame (Step 101), so as to find out line segment defects of the frame. The checking program further includes searching intersected line segments on the line segment path, and setting intersections where the intersected line segments are intersected with one another as first nodes (Step 1011). The intersection for the line segments refer to points where the line segments are overlapped with one another, and the first nodes can be set, for example, by searching coordinates of each line segment in the circuit diagram and the intersected line segments, and setting points in the line segments having the same coordinates as in the neighboring line segments as the first nodes.

Then, after Step 1011, end points of the intersected line segments closest to the corresponding first nodes are computed (Step 1012), so as to find exceeding line segments. The end points refer to points at the ends of the line segments, and the process for computing to find the exceeding line segments can be, for example, finding out the coordinates of the end point of the intersected line segments and coordinates of the first nodes in the intersected line segments, and calculating the distances between the coordinates of each of the end points and the coordinates of the first nodes, so as to obtain line segments between the end points of the line segments and the closest first nodes. Moreover, persons skilled in the art can readily understand that, if the line segment path does not have intersected line segments (i.e., line segment intersection), Steps 1011 and 1012 can be omitted.

If the line segment path does not have intersected line segments, the partial line segments, that are not intersected with another one(s), of the line segment path are searched form the line segment path, and an extension line segment extended from each end point of each the searched partial line segments is computed in advance (Step 1013). The extension line segments refer to extensions of the original line segments along straight-line directions, and the process of extending the line segments can be, for example, calculating a linear equation for each of the line segments according to the end points of the line segments (each line segment has two end points) with a program. For example, as for $y=ax+b$ ... (1), the linear equation can be obtained by substituting the known end points $P1(x1, y1)$ and $P2(x2, y2)$ into Equation (1).

Then, intersections where the extension line segments are intersected with another line segments are set as second nodes (Step 1014). The intersections in Step 1014 refer to points where each of the extension line segments is overlapped with another line segment, and the second nodes can be set by means of, for example, searching coordinates of each of the extension line segments in the circuit diagram through using a program, and setting points in the extension line segments having the same coordinates as in the neighboring line segments as the second nodes. In addition, persons skilled in the art can readily understand that, if the line segment path does not have intersected line segments (i.e., the line segment is discontinuous), Steps 1013 and 1014 can be omitted.

Once the line segment defects are found out, a line segment correction program is executed (Step 103). The line segment correction program further includes a step of deleting the exceeding line segments between the end points of the line segments and the first nodes (Step 1031). The deleted parts are line segments from the first nodes to the closest end points, including the deleted end points, so as to solve the problem of line segment intersection. Moreover, persons skilled in the art can readily understand that, if Steps 1011 and 1012 are omitted, Step 1031 can be omitted as well.

If the line segment path does not have any line segments that are intersected with one another, the end points of the partial line segments where the extension line segments belong to are connected to the closest second nodes (Step 1032). The process for connecting the line segments can be, for example, searching coordinates of the end points of the partial line segments where the extension line segments belong to through using a program, and connecting the coordinates of the end points of the partial line segments with the closest second nodes, so as to solve the problem of line segment discontinuity. Moreover, persons skilled in the art can readily understand that, if Steps 1013 and 1014 are omitted, Step 1032 can be omitted as well.

Once the computer confirms to return to the start point, the checking program is finished (Step 104). For example, in Step 104, whether it is returned to the start point or not can be determined by checking whether the coordinates are the same. Moreover, persons skilled in the art can readily understand that, Steps 1011 and 1012 can be exchanged with Steps 1013 and 1014, that is, Steps 1013 and 1014 are executed before Steps 1011 and 1012. At this time, Steps 1031 and 1032 will be adjusted accordingly. Such modifications still fall into the scope of the present invention.

Figure 1:
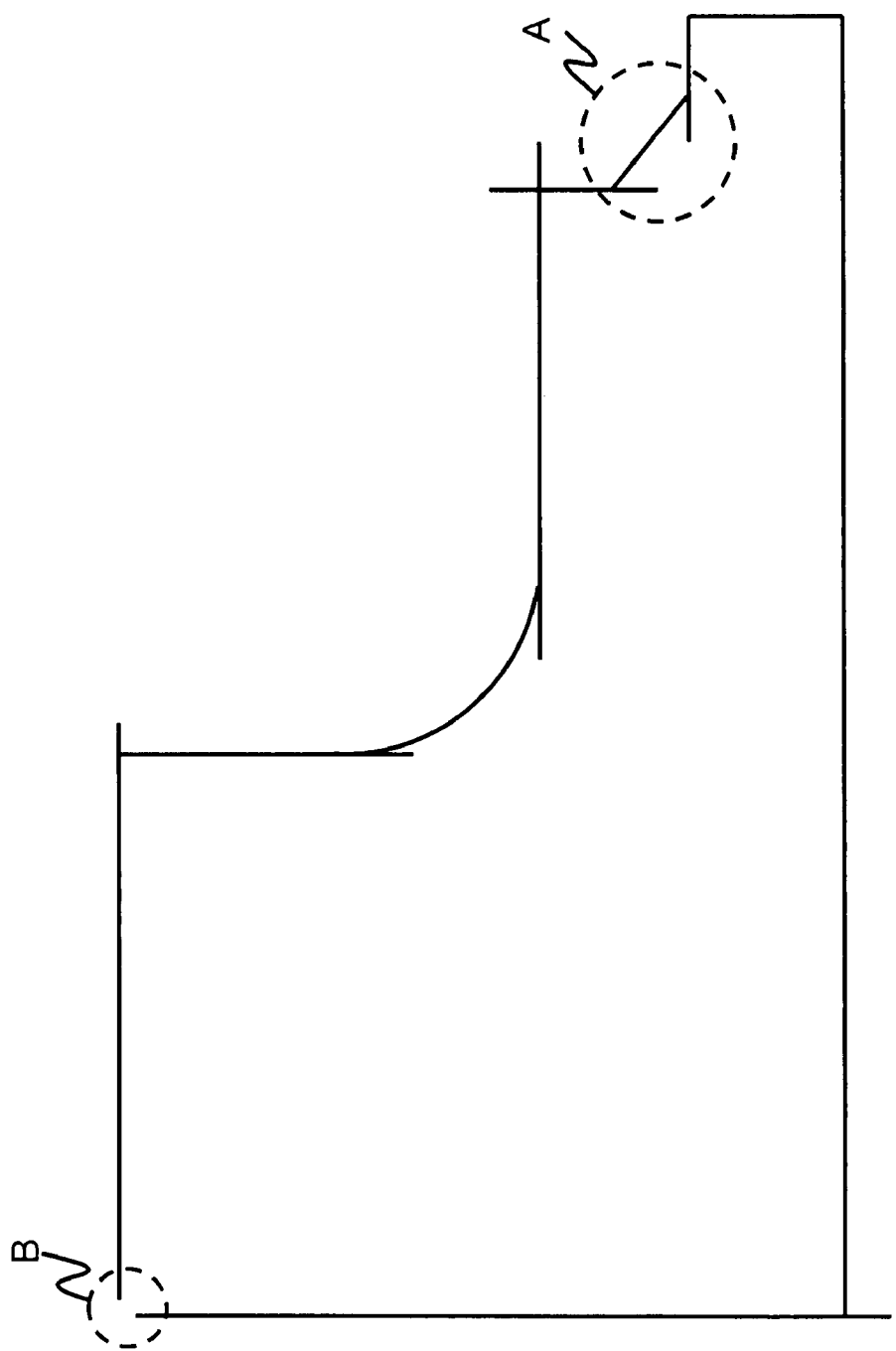
FIG. 1 is a schematic view showing intersection and discontinuity problems of line segments in the prior art.
Figure 3:
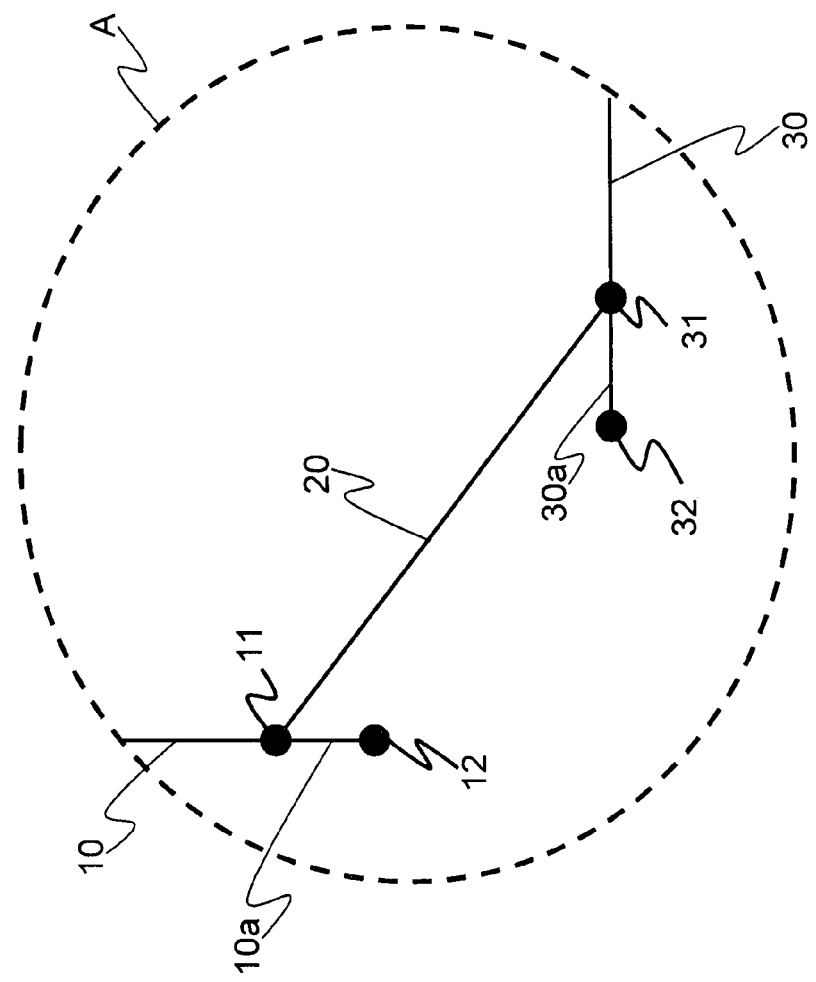
FIG. 3 is a schematic enlarged view of a line segment intersection part according to an embodiment of the present invention in comparison with FIG. 1.

FIG. 3 is a schematic enlarged view of a line segment intersection part according to an embodiment of the present invention in comparison with FIG. 1. As shown in FIG. 3, a line segment defect of line segment intersection is found out by the checking program. The line segment intersection part A includes a first line segment 10, a second line segment 20, and a third line segment 30. An intersection point between the first line segment 10 and the second line segment 20 is a first node 11, a point at the end of the first line segment 10 is an end point 12; an intersection point between the second line segment 20 and the third line segment 30 is a first node 31, and a point at the end of the third line segment 30 is an end point 32. Firstly, the coordinates of the first node 11 and the end point 12 of the first line segment 10 are searched through using a program, and then, the distance between the coordinates of the first node 11 and the end point 12 is calculated. Once it is determined that the distance between the coordinates of the first node 11 and the end point 12 is the shortest, the distance is set as an exceeding line segment 10*a*. Finally, the exceeding line segment 10*a* and the end point 12 are deleted.

Similarly, the coordinates of the first node 31 and the end point 32 of the third line segment 30 are searched through using the program, and then, the distance between the coordinates of the first node 31 and the end point 32 is calculated. Once it is determined that the distance between the coordinates of the first node 31 and the end point 32 is the shortest, the distance is set as an exceeding line segment 30*a*. Finally, the exceeding line segment 30*a* and the end point 32 are deleted.

Figure 4:
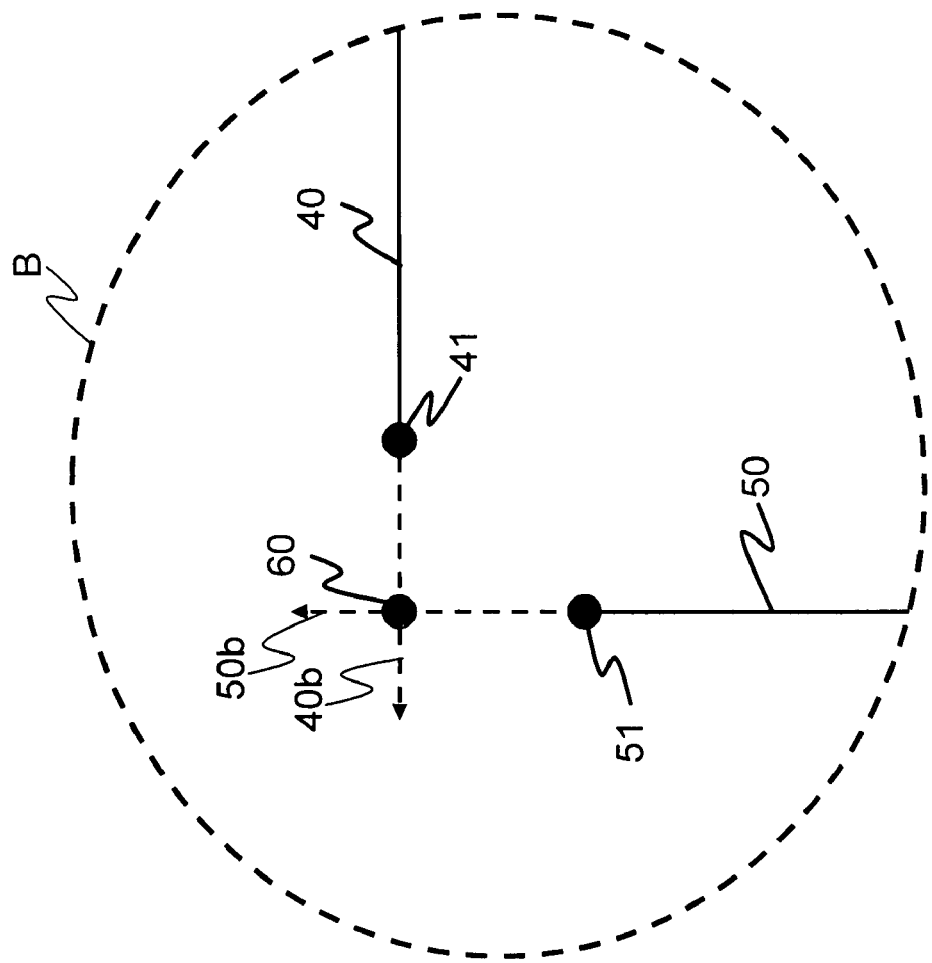
FIG. 4 is a schematic enlarged view of a line segment discontinuous part according to an embodiment of the present invention in comparison with FIG. 1.
Figure 5:
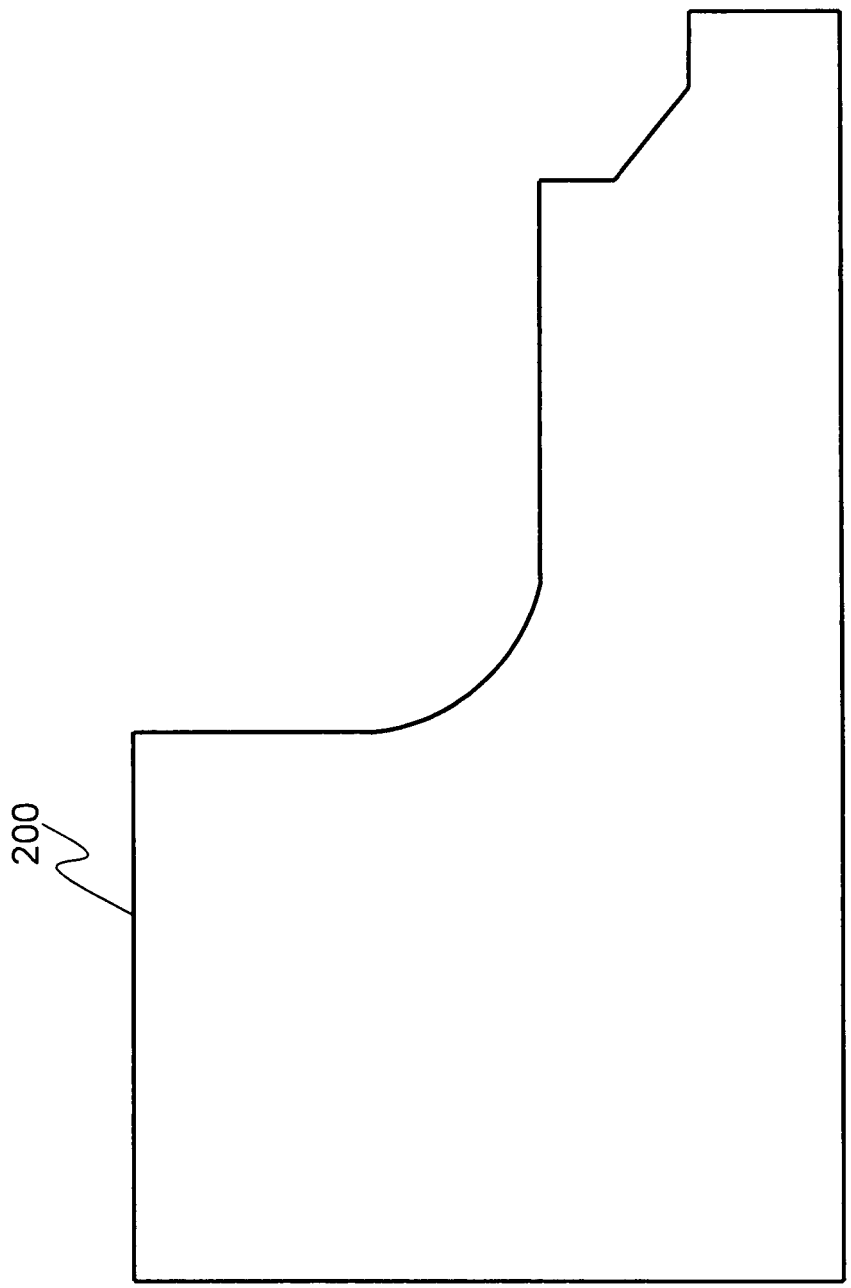
FIG. 5 is a schematic view of a frame of a circuit diagram according to an embodiment of the present invention.

FIG. 4 is a schematic enlarged view of a line segment discontinuous part according to an embodiment of the present invention in comparison with FIG. 1. As shown in FIG. 4, a line segment defect of line segment discontinuity is found out by the checking program. The line segment discontinuous part B includes a fourth line segment 40 and a fifth line segment 50. A point at the end of the fourth line segment 40 is an end point 41, and a line segment extending in a straight-line direction from the fourth line segment 40 is an extension line segment 40*b*. A point at the end of the fifth line segment 50 is an end point 51, and a line segment extending in a straight-line direction from the fifth line segment 50 is an extension line segment 50*b*. An intersection point between the extension line segment 40*b* of the fourth line segment 40 and the extension line segment 50*b* of the fifth line segment 50 is a second node 60. Firstly, the coordinates of the end point 41 and the end point 51 of the line segments where the extension line segment 40*b* and the extension line segment 50*b* respectively belong to are found out through using a program. Then, the end points 41 and 51 are connected to the closest second node 60. Moreover, FIG. 5 is a schematic view of a circuit diagram frame according to an embodiment of the present invention, and as shown in FIG. 5, the circuit diagram frame 200 does not have the problems of line segment intersection and line segment discontinuity any more.

To sum up, the method for automatically modifying a frame of a circuit diagram in the present invention uses a program to automatically determine the line segment defects in the circuit diagram, and correct the circuit diagram to output a complete one, so as to solve the problems of the circuit diagram caused by different adopted metric units, and thus, the human resources are saved, and the working process of product design is accelerated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for automatically modifying a frame of a circuit diagram, applicable for a computer-executable circuit layout software, and for modifying line segment defects of the circuit diagram generated after conversion, comprising:
   setting a start point on the frame of the circuit diagram;
   executing a checking program from the start point along a line segment path of the frame, to find out the line segment defects of the frame, wherein the checking program comprises:
   searching intersected line segments of the line segment path;
   setting the intersection as a first node; and
   computing an end point of each of the intersected line segments closest to the corresponding first node;
   executing a line segment correction program once the line segment defects are found, wherein the line segment correction program comprises:
   deleting an exceeding line segment between the end point of each of the line segments and the first node; and
   ending the checking program once it is confirmed to return to the start point.

2. The method for automatically modifying the frame of the circuit diagram as claimed in claim 1, wherein the checking program comprises:
   searching partial line segments, at least one end point of each not being an intersection, of the line segment path to compute an extension line segment extended from the end point of each the searched partial line segment;
   setting the intersection formed by the extension line segment and another line segment as a second node.

3. The method for automatically modifying the frame of the circuit diagram as claimed in claim 2, wherein the line segment correction program further comprises:
   connecting the end point of the partial line segment where the extension line segment belongs to with the closest second node.

* * * * *